(12) United States Patent
Abrevaya et al.

(10) Patent No.: US 8,343,880 B2
(45) Date of Patent: Jan. 1, 2013

(54) PROCESS FOR PREPARING A DIELECTRIC INTERLAYER FILM CONTAINING SILICON BETA ZEOLITE

(75) Inventors: Hayim Abrevaya, Kenilworth, IL (US); Richard R. Willis, Cary, IL (US); Stephen T. Wilson, Libertyville, IL (US)

(73) Assignee: UOP LLC, Des Plaines, IL (US)

( * ) Notice: Subject to any disclaimer, the term of this patent is extended or adjusted under 35 U.S.C. 154(b) by 917 days.

(21) Appl. No.: 12/356,201

(22) Filed: Jan. 20, 2009

(65) Prior Publication Data
US 2009/0197426 A1 Aug. 6, 2009

Related U.S. Application Data

(63) Continuation-in-part of application No. 11/012,809, filed on Dec. 15, 2004, now abandoned.

(51) Int. Cl.
*H01L 21/31* (2006.01)
(52) U.S. Cl. ......... 438/778; 257/E21.545; 257/E21.581; 427/58; 427/126.3; 427/376.2; 427/402
(58) Field of Classification Search .................... 427/58; 438/778, 783
See application file for complete search history.

(56) References Cited

U.S. PATENT DOCUMENTS

| | | | |
|---|---|---|---|
| 5,157,005 A | 10/1992 | Suppiah | 502/62 |
| 5,310,534 A | 5/1994 | Fajula et al. | 423/715 |
| 6,329,062 B1 | 12/2001 | Gaynor | 428/447 |
| 6,533,855 B1 | 3/2003 | Gaynor et al. | 106/287.14 |
| 6,573,131 B2 | 6/2003 | Yan et al. | 438/207 |
| 6,630,696 B2 | 10/2003 | Yan et al. | 257/200 |
| 6,660,245 B1 | 12/2003 | Gaynor et al. | 423/705 |
| 2004/0014592 A1 | 1/2004 | Yeh et al. | 502/64 |
| 2004/0167007 A1 | 8/2004 | Bedard | 501/32 |

FOREIGN PATENT DOCUMENTS

| | | |
|---|---|---|
| JP | 2002-160915 | 6/2002 |
| JP | 2004-168588 | 6/2004 |

OTHER PUBLICATIONS

M.A. Camblor et al in *Progress in Zeolite and Microporous Materials Studies in Surface Science and Catalysis*, vol. 105, H. Chan, S.-K. Ihm and Y.S. Uh (Editors) Elsevier Science, 1997, pp. 341-348.

M.A. Camblor et al, *Microporous and Mesoporous Materials*, 25 (1998) pp. 59-74.

*Primary Examiner* — Mark A Osele
*Assistant Examiner* — Nickolas Harm
(74) *Attorney, Agent, or Firm* — Mark Goldberg

(57) ABSTRACT

A process for forming a zeolite beta dielectric layer onto a substrate such as a silicon wafer has been developed. The zeolite beta is characterized in that it has an aluminum concentration from about 0.1 to about 2.0 wt. %, and has crystallites from about 5 to about 40 nanometers. The process involves first dealuminating a starting zeolite beta, then preparing a slurry of the dealuminated zeolite beta followed by coating a substrate, e.g. silicon wafer with the slurry, heating to form a zeolite beta film and treating the zeolite beta with a silylating agent.

20 Claims, No Drawings

US 8,343,880 B2

PROCESS FOR PREPARING A DIELECTRIC INTERLAYER FILM CONTAINING SILICON BETA ZEOLITE

CROSS-REFERENCE TO RELATED APPLICATION

This application is a Continuation-In-Part of copending application Ser. No. 11/012,809 filed Dec. 15, 2004, the contents of which are hereby incorporated by reference in its entirety.

FIELD OF THE INVENTION

The present invention relates to a process for depositing a zeolite beta dielectric layer onto a silicon wafer substrate which is a part of an integrated circuit. The process involves first dealuminating a starting zeolite beta, then preparing a slurry of the dealuminated zeolite beta followed by coating the substrate with the slurry and heating the coated substrate to evaporate the solvent thereby forming a zeolite beta film on the substrate and finally silylating the zeolite beta film.

BACKGROUND OF THE INVENTION

The next generation of microelectronic devices will require an increase in the density of circuit elements per unit volume. As the distance between the metal lines decreases, there will be increased problems due to capacitive coupling (cross talk) and propagation delay. This problem can be avoided or minimized if the circuit wires are separated by insulator layers of increasingly lower dielectric constant. Because of these requirements, attention has been focused on developing porous dielectric materials. One such class of materials are zeolitic materials, and especially virtually aluminum free zeolitic materials.

For example U.S. Pat. No. 6,329,062 B1 discloses a two component porous material including small silicalite crystals in a porous binder which provides a low dielectric constant material useful as an insulating layer in microelectronic devices. The silicalite nanocrystals are smaller than the characteristic dimensions of the features on the integrated circuit device, while the binder is an amorphous porous material that links the silicalite nanocrystals together. The '062 reference states that the aluminum concentration in the silicalite is to be less than 1 part in 10,000 (0.01 wt. %). U.S. Pat. No. 6,533,855 B1 discloses the chemical modification of the surface of silicalite and high silica zeolite nanoparticles permitting such particles to be dispersed in non-polar hydrophobic solvents which can then be used to form interlayer dielectric layers. U.S. Pat. No. 6,573,131 B2 discloses a process for producing a silica zeolite film on a semi-conductor substrate in which a zeolite synthesis composition is prepared from a silica source and an organic hydroxide zeolite structure directing agent, coating the substrate with this synthesis composition and heating the substrate and synthesis composition to produce a silica zeolite film on the substrate. Finally, U.S. Pat. No. 6,660,245 B1 discloses a process for removing structured directing agents from a silicalite or zeolite crystal low dielectric constant film by using oxidative attack with a combination of ammonia, water, and hydrogen peroxide at elevated temperatures.

As the above cited art shows, it is generally taught that the zeolite be essentially free of aluminum in order for it to have a low enough dielectric constant. Applicants have determined that zeolite beta would have desirable properties as a low-k dielectric insulator even when it contains a considerable amount of aluminum in the framework (versus other zeolite dielectric materials). Applicants have discovered that it is extremely difficult to synthesize zeolite beta having both a lower aluminum content (about 0.1 wt. % to about 2 wt. % Al) and having crystallites on the order of 5 to 40 nanometers in size. Applicants have developed a process in which zeolite beta containing silicon and aluminum is first synthesized to give crystallites in the nanometer range and than dealuminated thereby removing a portion of the aluminum. A slurry of this lower aluminum containing zeolite beta with crystallites on the order of 5-40 nanometers can now be spin coated onto silicon wafers to form a thin film and then baked to remove the organic template and optionally chemically treated to neutralize any terminal hydroxides and provide a low dielectric constant insulating layer.

SUMMARY OF THE INVENTION

One embodiment of the invention is a process for depositing zeolite beta dielectric layer onto a substrate comprising dealuminating a starting zeolite beta at dealumination conditions to provide a dealuminated zeolite beta having a an aluminum content in the framework from about 0.1 to about 2.0 wt. % and comprising crystals having an average diameter from about 5 to about 40 nanometers, slurrying the dealuminated zeolite beta in a solvent selected from the group consisting of polar organics, water, polyols and mixtures thereof to form a slurry, coating the substrate with the slurry, heating the coated substrate to evaporate the solvent and form a zeolite beta film on the substrate; treating the zeolite beta with a silylating agent at silylation conditions to substantially reduce the terminal hydroxyl groups on the zeolite; and where the substrate comprises a silicon wafer which is part of an integrated circuit.

Another embodiment of the invention is a process for preparing a nano-crystalline zeolite beta composition having an aluminum concentration in the framework from about 0.1 to about 2.0 wt. %, comprising providing a starting zeolite beta having a composition on an as synthesized and anhydrous basis expressed by an empirical formula of:

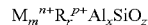

$$M_m^{n+}R_r^{p+}Al_xSiO_z$$

where M is at least one exchangeable cation selected from the group consisting of alkali and alkaline earth metals, R is an organic cation selected from the group consisting of tetraethylammonium ion, dibenzyldimethyl ammonium ion, dibenzyl-1,4-diaza-bicyclo [2.2.2] octane, diethanol amine and mixtures thereof, "m" is the mole fraction of M and has a value from 0 to about 0.125, "n" is the weighted average valence of M and has a value of about 1 to about 2, "r" is the mole fraction of R and has a value of about 0.1 to about 0.5 "p" is the weighted average valence of R and has a value of about 1 to about 2, "x" is the mole fraction of Al and has a value from about 0.01 to about 0.25 and "z" is the mole fraction of O and has a value from about 2.02 to about 2.25 and characterized in that it comprises crystals having an average diameter of about 5 to about 40 nanometers; dealuminating the starting zeolite beta at dealumination conditions thereby removing at least a fraction of the aluminum atoms from the framework and provide a nano-crystalline zeolite beta having a an aluminum concentration in the framework from about 0.1 to about 2.0 wt. %.

These and other embodiments will become more clear after the detailed description of the invention.

DETAILED DESCRIPTION OF THE INVENTION

As stated, this invention relates to a process for depositing a zeolite beta film onto a substrate which is part of an integrated circuit. Zeolite beta is a well known zeolite and is described in RE-28,341 which is incorporated by reference in its entirety. It is stated in the 341' patent that zeolite beta has a composition described by the formula:

[XNa(1.0+/−0.1−X)TEA]AlO$_2$.YSiO$_2$.WH$_2$O

Where X is less than 1, preferably less than 0.75; TEA represents tetraethylammonium ion; Y is greater than 5 but less than 100 and W is up to about 4 depending on the condition of dehydration and on the metal cation present. The zeolite beta is formed by crystallization from a reaction mixture which contains reactive forms of aluminum, silicon, tetraethyl ammonium ion, and alkali or alkaline earth metal such as sodium and water. Crystallization is carried out at a temperature from about 75° C. to about 200° C. and atmospheric pressure. There are a number of patents which disclose various other methods of preparing zeolite beta and include U.S. Pat. No. 4,554,145 which discloses the use of dibenzyl-1,4-diaza-bicyclo [2.2.2] octane compound as the structure directing agent; U.S. Pat. No. 4,642,226 discloses the use of dibenzyl dimethyl ammonium ion as the templating agent; U.S. Pat. No. 5,139,759 discloses the use of diethanol amine in addition to tetraethyl ammonium ion for the synthesis of zeolite beta; U.S. Pat. No. 5,256,392 discloses treating a synthesized zeolite beta with an ion exchange medium and than calcining at a temperature of about 400° to 700° C. followed by another ion exchange treatment and U.S. Pat. No. 5,427,765 discloses reacting a granular amorphous alumino silicate with alkaline metal hydroxide and tetraethyl ammonium compound to produce zeolite beta. All of the above referenced US patents are incorporated in their entirety for their teachings of various synthesis methods of zeolite beta.

Although any of the methods described above can be used to synthesize zeolite beta, the following process is usually preferred. A reaction mixture is prepared from a silicon source, an aluminum source, a TEA source, and water; sources of silica include but are not limited to tetraethyl orthosilicate, colloidal silica, precipitated silica, and alkali silicates. The sources of aluminum include but are not limited to aluminum alkoxides, precipitated alumina, aluminum metal, sodium aluminate, aluminum salts, and alumina salts. Sources of the TEA ion include but are not limited to the hydroxide and halide compounds. The reaction mixture has a composition given by the empirical formula:

dNa$_2$O:SiO$_2$:aAl$_2$O$_3$:bTEA:cH$_2$O

Where "a" has a value from about 0.004 to about 0.125, "b" has a value from about 0.10 to about 0.5, "c" has a value from about 5 to about 30, and "d" has a value from 0 to about 0.1. The reaction mixture is now reacted at a temperature of about 90° C. to about 140° C. for a period of about 0.5 days to about 40 days in a sealed reaction vessel under autogenous pressure. After crystallization is complete, the solid product is isolated from the heterogeneous mixture by means such as filtration or centrifugation and then washed with deionized water and dried in air at ambient temperature up to about 100° C. As will be shown in the examples, by controlling the reaction mixture one can obtain zeolite beta with nano sized crystallites. The synthesis of nano-crystalline zeolite beta is also reported in the literature. See, 1) M. A. Camblor et al in *Progress in Zeolite and Microporous Materials Studies in Surface Science and Catalysis*, Vol. 105, H. Chan, S.-K. Ihm and Y. S. Uh editors. Elsevier Science, 1997, pp. 341-348; and 2) M. A. Camblor et al, *Microporous and Mesoporous Materials*, 25 (1998) pp. 59-74 both of which are incorporated by reference.

The resulting zeolite beta has a composition on an as synthesized and anhydrous basis expressed by an empirical formula of:

M$_m^{n+}$R$_r^{p+}$Al$_x$SiO$_z$ where M is at least one exchangeable cation selected from the group consisting of alkali and alkaline earth metals, R is an organic cation selected from the group consisting of tetraethylammonium ion, dibenzyl-dimethylammonium ion, dibenzyl-1,4-diazo-bicyclo [2.2.2] octane, diethanol amine and mixtures thereof, "m" is the mole fraction of M and has a value from 0 to about 0.125, "n" is the weighted average valence of M and has a value of about 1 to about 2, "r" is the mole fraction of R and has a value of about 0.1 to about 0.5, "p" is the weighted average valence of R and has a value of about 1 to about 2, "x" is the mole fraction of Al and has a value from about 0.01 to about 0.25 and "z" is the mole fraction of O and has a value from about 2.02 to about 2.25.

The next step in the process of the invention is to treat the synthesized beta zeolite in order to remove aluminum atoms from the framework and optionally substitute silicon atoms into those sites. Although the dealumination process described below will remove the organic cation from the exchange sites in the zeolite beta, optionally the zeolite beta can be calcined at a temperature of about 350° C. to about 650° C. for a time sufficient (usually about 30 minutes to about 10 hours) to remove the organic template and thus increase the effectiveness of the dealumination. One method of dealuminating the zeolite beta involves the use of a fluorosilicate salt. The fluorosilicate salt serves two purposes. It removes aluminum atoms from the framework and provides a source of extraneous silicon, which can be inserted into the framework (replacing the aluminum). A detailed description of this process can be found in U.S. Pat. No. 4,610,856 which is incorporated in its entirety by reference.

Another method of dealuminating zeolite beta is to contact it with an acid (acid extraction). The acids which can be used in carrying out acid extraction include without limitation mineral acids, carboxylic acids and mixtures thereof. Examples of these include sulfuric acid, nitric acid, ethylene diaminetetraacetic acid (EDTA), citric acid, oxalic acid, etc. The concentration of acid which can be used is not critical but is conveniently between about 1 wt. % to about 80 wt. % acid and preferably between 5 wt. % and 40 wt. % acid. Acid extraction conditions include a temperature of about 10° C. to about 100° C. for a time of about 10 minutes to about 24 hours. Once treated with the acid, the zeolite beta is isolated by means such as filtration, washed with deionized water and optionally dried at ambient temperature up to about 100° C.

The dealuminated nano-beta zeolite which has an aluminum concentration in the framework from about 0.1 to about 2.0 wt. %, is now dispersed in a solvent in order to form a slurry. The solvents which can be used for this purpose include but are not limited to polyols, water, polar organics and mixtures thereof. Examples of polyols include but are not limited to ethylene glycol, propylene glycol and glycerol. Examples of polar organic solvents include but are not limited to methanol, ethanol, isopropanol, t-butanol, isopropanol, hexanol, octanol, decanol, tetrahydrofuran, dimethylformamide, dimethylsulfoxane, acetone, methyl ethyl ketone, acetonitrile and methylene chloride. Optionally, a dispersing agent compatible with the solvent composition including but not limited to ethyltrimethylammonium bromide, anionic and cationic polyelectrolytes, non-ionic surfactants and polyols can be used. The amount of zeolite beta in the slurry can vary considerably but usually is from about 0.05 to about 10 wt. % and preferably from about 0.1 to about 2 wt. %, while the amount of dispersing agent can vary from 0 to about 1 wt. %. The zeolite beta slurry may optionally contain a binding agent to help bind the zeolite film to the substrate. Examples of binding agents include but are not limited to tetraethylorthosilicate (TEOS), methyltrimethoxysilane, methyltriethoxysilane, aqueous or alcoholic colloidal silica and mixtures thereof.

Having obtained a zeolite beta slurry, it is next deposited onto a substrate by spin coating techniques which are well known in the art. Spin coating techniques are disclosed in U.S. Pat. No. 6,329,062 B1 and U.S. Pat. No. 6,573,131 B2 which are incorporated by reference in their entirety. The substrate which is used is usually a silicon wafer substrate typically used in integrated circuit devices. Once the zeolitic film is deposited onto the substrate, the film and substrate are heated to a temperature of about 200 to about 400° C. and for a time sufficient to evaporate the solvent and bind the crystals to the substrate. Usually this time can vary from about 30 seconds to about 3 hours and preferably from about 1 minute to about 15 minutes.

In order to obtain a layer with a low k, it is necessary to chemically modify the zeolite beta in order to remove or substantially reduce terminal hydroxyl groups on the zeolite. The chemical modification is usually done by treating the zeolite beta with a silylating agent at silylation conditions. Silylation can be carried out on the zeolite beta either before depositing it onto the substrate, i.e. before preparing a slurry or after the zeolite film has been formed on the substrate. Silylation is carried out by contacting the zeolite beta film with a silylating agent at silylation conditions which are well known. Silylation can be done either in the liquid or gas phase. In the liquid phase, silylation is carried out in a batch mode by admixing the zeolite and silylating agent at a temperature of about 10° C. to about 150° C. and contacting for a time of about 10 minutes to about 72 hours. The silylation agent can be used neat or can de dissolved in a solvent such as toluene, acetone or methanol. Alternatively, the silylating agent (neat or in a solvent) can be vaporized and contacted with the zeolite at temperatures and times as described above. The gas phase process is preferred when silylation is carried out on the zeolite film. When silylation is completed, the coated zeolite (either as a powder or film) is heated at a temperature of about 300° C. to about 500° C. for a time sufficient to convert the silylating agent to silica and remove as much organic material as possible. This time will vary from about 30 seconds to about 4 hours; and preferably from about 2 minutes to about 1 hour. Silylating agents which can be used can be described by the empirical formula $R_mSiX_n$, where R is an organic group, X is a halogen, organoaminosilane or an organic alcoxy group, m varies from 1 to 3 and n=4−m. Examples of silylating agents include but are not limited to trimethyl chlorosilane and hexamethyldisilazane.

In order to more fully illustrate the invention, the following examples are set forth. It is to be understood that the examples are only by way of illustration and are not intended as an undue limitation on the broad scope of the invention as set forth in the appended claims.

Example 1

Several samples of zeolite beta were prepared according to the following procedure. An aluminosilicate reaction mixture was prepared in the following manner. Aluminum sec-butoxide (95+%) was added to TEAOH (35%) with vigorous stirring. To this mixture, deionized water was added, followed by the addition of fumed silica (Cabosil™). The reaction mixture was homogenized for 1 hr with a high speed mechanical stirrer and was then transferred to a Teflon™-lined autoclave. The autoclave was placed in an oven set at 140° C. and the mixture reacted for various amounts of time at autogenous pressure. The solid product was collected by centrifugation, washed with water, and dried at 100° C. Table 1 presents the make up of the reaction mixture, reaction conditions and the Si/Al molar ratio of the zeolite beta product.

TABLE 1

| Sample I.D. | Reaction Mixture Composition* | | | | React. Cond. | | | Crystal Size (nm) |
|---|---|---|---|---|---|---|---|---|
| | $SiO_2$ | $Al_2O_3$ | TEAOH | $H_2O$ | T (°C.) | Time (days) | Si/Al | |
| A | 100 | 1 | 54 | 1500 | 140 | $5^1$ | 20 | 20-40 |
| B | 100 | 1 | 54 | 1500 | 140 | $5^2$ | 20 | 20-40 |
| C | 100 | 4 | 60 | 1500 | 140 | $10^1$ | 10 | 10-15 |
| D | 100 | 4 | 60 | 1500 | 140 | $10^1$ | 12 | 10-15 |
| E | 100 | 6.25 | 64.5 | 1500 | 140 | $30^2$ | NA | 5-10 |
| F | 100 | 6.25 | 64.5 | 1500 | 140 | $30^2$ | 8 | 5-10 |
| G | 100 | — | 40 | 1200 | 140 | $7^2$ | ∞ | 250-500 |

*Mole Ratio;
[1]stirred;
[2]static;
NA = not analyzed

Example 2

Portions of the above samples were treated to remove the aluminum. The treatment conditions, wt. % aluminum before and after dealumination, and pore volume before and after dealumination are presented in Table 2.

TABLE 2

| Sample I.D. | Treatment Conditions* | Al (Wt %) Before | Al (Wt %) After | Pore Volume (cc/g) Before | Pore Volume (cc/g) After |
|---|---|---|---|---|---|
| A | calcined; 16N $HNO_3$ | 2.12 | 0.011 | 0.260 | 0.224 |
| B | as synthesized; 16N $HNO_3$ | 2.16 | 0.11 | — | — |
| C | calcined; 2 times 4N $HNO_3$ | 3.2 | 0.012 | 0.213 | 0.184 |
| D | as synthesized; 16N $HNO_3$ | 2.9 | 0.044 | — | — |
| E | as synthesized; 16N $HNO_3$ | | 0.0121 | — | — |
| F | as synthesized; 2 times, 16N $HNO_3$ | 5.08 | 0.079 | 0.177 | 0.170 |
| F | calcined; 2 times, 16N $HNO_3$ | 5.08 | 0.0045 | | |

*Calcination was carried out at 550° C. for 4 hours. Treatment with nitric acid was carried out at 75° C. for 16 hours.

Table 2 shows that nitric acid treatment can remove a substantial amount of aluminum while maintaining crystallinity as shown by the retention of pore volume. The results also indicate that calcination prior to contact with the acid results in a greater removal of aluminum.

Example 3

A portion of dealuminated sample A was formed into a film as follows. Sample A was dispersed in ethanol to provide a slurry containing 0.77 wt. % solids. A 1.5 ml portion of this zeolite beta slurry was spin coated onto a 200 mm diameter silicon wafer at 700 rpm. The wafer was then baked at 350° C. for 1 minute under nitrogen. Next the wafer was spin coated with hexamethyldisilazane (HMDS) using the same procedure. A second wafer with a zeolite beta (sample A) film was prepared using the same procedure. The film thickness for each wafer was determined to be 100 nm. Finally, the dielectric constant was measured and determined to be 1.6 and 2.1 respectively.

It is anticipated that the dielectric constant for zeolites having an aluminum content from about 0.1 to about 2.0 wt. % should be constant throughout this Al range and have a value of about 1.6-2.1.

The invention claimed is:

1. A process for depositing a zeolite beta dielectric layer onto a substrate, comprising dealuminating a starting zeolite beta at dealumination conditions to provide a dealuminated zeolite beta having an aluminum concentration in a framework from about 0.1 to about 2.0 wt. %, and comprising crystals having an average diameter from about 5 to about 40 nanometers; slurrying the dealuminated zeolite beta in a solvent selected from the group consisting of polar organics, water, polyols and mixtures thereof to form a slurry; coating the substrate with the slurry and heating the coated substrate to evaporate the solvent and form a zeolite beta film on the substrate; treating the zeolite beta film with a silylating agent at silylation conditions to reduce the terminal hydroxyl groups on the zeolite; and where the substrate comprises a silicon wafer which is part of an integrated circuit.

2. The process of claim 1 where the dealumination comprises contacting the starting zeolite with a dealuminating agent at dealumination conditions.

3. The process of claim 2 where the dealuminating agent is selected from the group consisting of acids, fluorosilicate compounds and mixtures thereof.

4. The process of claim 3 where the acid is selected from the group consisting of sulfuric acid, nitric acid, ethylene diaminetetraacetic acid (EDTA), citric acid, oxalic acid and mixtures thereof.

5. The process of claim 4 where the dealumination conditions comprise a temperature of about 10° C. to about 100° C. and a time of about 10 minutes to about 24 hours.

6. The process of claim 1 where the coated substrate is heated at a temperature of about 200° C. to about 400° C. and for a time of about 30 seconds to about 3 hours.

7. The process of claim 1 further comprising calcining the starting zeolite prior to dealuminating the zeolite and where the calcination is carried out at a temperature of about 350° C. to about 650° C. and for a time of about 30 minutes to about 10 hours.

8. The process of claim 1 where the slurry further comprises a dispersing agent selected from the group consisting of non-ionic surfactants, polyols, anionic and cationic polyelectrolytes, ethyltrimethylammonium bromide and mixtures thereof.

9. The process of claim 1 where the slurry further comprises a binder selected from the group consisting of tetraethylorthosilicate, methyltrimethoxysilane, colloidal silica and mixtures thereof.

10. The process of claim 8 where the slurry further comprises a binder selected from the group consisting of tetraethylorthosilicate, methyltrimethoxysilane, colloidal silica and mixtures thereof.

11. The process of claim 1 where the silylating agent selected from the group consisting of trimethylchlorosilane, dimethlychlorosilane, hexamethyldisilazane, and mixtures thereof.

12. The process of claim 1 where the silylation step is carried out after the zeolite film is deposited on the substrate.

13. The process of claim 12 where the silylated zeolite beta film is heated to a temperature of about 300° C. to about 500° C. for a time of about 30 seconds to about 4 hours.

14. The process of claim 1 where the silylating conditions comprise a temperature of about 10° C. to about 150° C. and a time of about 10 minutes to about 72 hours.

15. The process of claim 1, further comprising synthesizing the starting zeolite from a reaction mixture comprising a silicon source, an aluminum source, a TEA source, and water.

16. The process of claim 15, wherein the silicon source comprises at least one of tetraethyl orthosilicate, colloidal silica, precipitated silica, and alkali silicates.

17. The process of claim 15, wherein the aluminum source comprises at least one of aluminum alkoxides, precipitated alumina, aluminum metal, sodium aluminate, aluminum salts, and alumina salts.

18. The process of claim 1 wherein the starting zeolite is synthesized from a reaction mixture having a composition given by the empirical formula $dNa_2O:SiO_2:aAl_2O_3:bTEA:cH_2O$, where "a" has a value from about 0.004 to about 0.125, "b" has a value from about 0.10 to about 0.5, "c" has a value from about 5 to about 30, and "d" has a value from 0 to about 0.1.

19. A process for depositing a zeolite beta dielectric layer onto a substrate comprising: synthesizing a starting zeolite beta from a reaction mixture having a silica source and an aluminum source; dealuminating the starting zeolite beta at dealumination conditions to provide a dealuminated zeolite beta having an aluminum concentration in a framework from about 0.1 to about 2.0 wt. % and comprising crystals having an average diameter from about 5 to about 40 nanometers; slurrying the dealuminated zeolite beta in a solvent selected from the group consisting of polar organics, water, polyols and mixtures thereof to form a slurry; coating the substrate with the slurry and heating the coated substrate to evaporate the solvent and form a zeolite beta film on the substrate; treating the zeolite beta film with a silylating agent at silylation conditions to reduce the terminal hydroxyl groups on the zeolite; and where the substrate comprises a silicon wafer which is part of an integrated circuit.

20. The process of claim 19 wherein the starting zeolite is synthesized from a reaction mixture having a composition given by the empirical formula $dNa_2O:SiO_2:aAl_2O_3:bTEA:cH_2O$, where "a" has a value from about 0.004 to about 0.125, "b" has a value from about 0.10 to about 0.5, "c" has a value from about 5 to about 30, and "d" has a value from 0 to about 0.1.

* * * * *